(12) United States Patent
Peterson et al.

(10) Patent No.: US 6,374,906 B1
(45) Date of Patent: Apr. 23, 2002

(54) HEAT SINK HAVING A CAPTIVE HANDLE

(75) Inventors: Eric C. Peterson, McKinney; William K. Coxe; Paul T. Artman, both of Dallas, all of TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/547,082

(22) Filed: Apr. 11, 2000

(51) Int. Cl.[7] .............................. F28F 7/00; H05K 7/20
(52) U.S. Cl. ..................... 165/80.3; 165/185; 361/710
(58) Field of Search ................. 165/80.3, 185; 257/719, 718; 361/711–710

(56) References Cited

U.S. PATENT DOCUMENTS

| | | | | |
|---|---|---|---|---|
| 5,386,338 A | * | 1/1995 | Jordan et al. | 361/704 |
| 5,662,163 A | * | 9/1997 | Mira | 165/80.3 |
| 5,901,039 A | * | 5/1999 | Dehaine et al. | 257/719 |
| 5,912,804 A | * | 6/1999 | Lawson et al. | 257/718 |
| 5,933,325 A | * | 8/1999 | Hou | 361/704 |
| 5,966,289 A | * | 10/1999 | Hastings et al. | 361/709 |
| 5,999,402 A | * | 12/1999 | Jeffries et al. | 165/80.3 |
| 6,061,235 A | * | 5/2000 | Cromwell et al. | 257/718 |
| 6,084,774 A | * | 7/2000 | Talbot et al. | 361/704 |
| 6,111,752 A | * | 8/2000 | Huang et al. | 361/704 |
| 6,151,217 A | * | 11/2000 | Thomsen | 361/709 |
| 6,157,539 A | * | 12/2000 | Wagner et al. | 165/80.3 |
| 6,181,559 B1 | * | 1/2001 | Seo | 361/704 |
| 6,249,428 B1 | * | 6/2001 | Jeffries et al. | 361/697 |

* cited by examiner

Primary Examiner—Ira S. Lazarus
Assistant Examiner—Tho Van Duong

(57) ABSTRACT

A cooling device having a handle movably attached to a heat sink. The handle is attached to the heat sink by the use of captive fasteners. The captive fasteners serve the additional function of securing the cooling device to a heat-generating device. Springs are located between the handle and the heat sink and compress when the cooling device is attached to the heat-generating device. The springs cause a spring force to be applied between the cooling device and the heat-generating device which is maintained as the heat-generating device and the cooling device undergo thermal expansion and contraction.

18 Claims, 6 Drawing Sheets

US 6,374,906 B1

HEAT SINK HAVING A CAPTIVE HANDLE

TECHNICAL FIELD OF THE INVENTION

The present invention relates to heat sinks and, more particularly, to a heat sink having a movable and captive handle attached thereto.

BACKGROUND OF THE INVENTION

Heat sinks are devices that cool heat sources by drawing heat away from the heat sources and convecting the heat to the surrounding atmosphere. Heat sinks are typically made of a heat conductive material, such as aluminum, magnesium, or copper, and have a base portion with a plurality of cooling fins attached thereto. The base portion serves to draw heat from the heat source into the heat sink. The base portion also spreads and transfers the heat to the cooling fins. The cooling fins provide a large surface area, which facilitates the convection of heat to the surrounding atmosphere.

The size and shape of a particular heat sink depends on its application. For example, the base portion is contoured to match the shape of the heat source and is generally appropriately sized to contact the heat source. In many applications, the heat source is an electronic component, such as an integrated circuit having a planar surface, which requires that the base portion be substantially planar. The amount of surface area on the cooling fins is proportional to the amount of heat that the heat sink is able to convect to the surrounding atmosphere. Heat sinks that are required to remove large amounts of heat from a heat source tend to have many cooling fins. The cooling fins provide a large surface area that convects large amounts of heat to the surrounding atmosphere.

Heat sinks are typically fabricated from metals, which provide good thermal conductivity and are relatively easy to fabricate into heat sinks. Metal heat sinks are also durable, which permits them to be securely fastened directly to the heat source. Metals, however, tend to be relatively heavy, making larger heat sinks relatively heavy.

Some heat sinks are used to cool heat-generating electronic components located within various electronic devices. The trend in the design of many of these electronic devices is to reduce the size and weight of the electronic devices and increase their capabilities, which generally increases their power consumption. The increased power consumption in conjunction with the smaller sized electronic devices causes the electronic devices to generate greater amounts of heat within smaller confines, which increases the heat density. Thus, the heat sinks used within these electronic devices have to be relatively large in order to convect the increased amount of heat generated by these electronic devices, which is contrary to the design objective of reducing the size of electronic devices. In addition, the large heat sinks increase the weight of the electronic devices, which is also contrary to the design objective of reducing the weight of electronic devices.

Another problem with large heat sinks is that they tend to be rather cumbersome to install within the small confines of small electronic devices. For example, the heat sinks may be difficult to hold in a fixed location as they are being secured within the electronic device by various hardware components, e.g., screws. As a further example, a heat sink may be secured within the electronic device by the use of a plurality of screws, washers, and nuts. During installation or removal of the heat sink, the screws, washers, and/or nuts may fall into the electronic device, which may cause other components of the electronic device to electrically short. Furthermore, heat sinks may damage components located within the electronic devices during their installation and removal. For example, if a large metal heat sink strikes a wire or electronic component during installation or removal, the wire or electronic component may become damaged, which may, in turn, render the electronic device inoperable.

Another problem with some heat sinks is that they become too hot to manually handle during their operation. This presents a problem if a hot heat sink must be removed from the electronic device. For example, if the heat sink must be removed in order to service the electronic device, the electronic device must be powered down and rendered inoperable for a period during which the heat sink cools. This period of inoperability of the electronic device may be burdensome to the user of the electronic device.

Therefore, a need exists for a cooling device that is able to convect a large amount of heat to the surrounding atmosphere, that is relatively easy to install within and remove from an electronic device, and that occupies minimal space.

SUMMARY OF THE INVENTION

The invention is directed toward a cooling device having a movable handle attached thereto. The cooling device may comprise a heat sink having a base portion and at least one cooling fin attached to the base portion. The handle may be attached to the base portion by the use of captive fasteners, such as captive screws. The captive fasteners may also serve to fasten the cooling device to a heat-generating device which the cooling device serves to cool. As the heat sink is fastened to the heat-generating device, the handle is drawn into close proximity to the heat sink by the fasteners. Thus, the space occupied by the cooling device is reduced as the heat sink is fastened to the heat-generating device.

In a further embodiment of the cooling device, detent mechanisms, such as springs, may be located between the heat sink base portion and the handle. The detent mechanisms may apply a force between the base portion and the handle, which serves to retain the handle in a fixed position relative to the heat sink prior to the heat sink being fastened to the heat-generating device. The detent mechanisms may also serve to apply a constant force between the heat sink base portion and the heat-generating device when the heat sink is fastened to the heat-generating device. This constant force assures that the base portion remains in thermal contact with the heat-generating device as both are subject to different amounts of physical shock and thermal expansion and contraction.

DETAILED DESCRIPTION OF THE INVENTION

Figure 1:
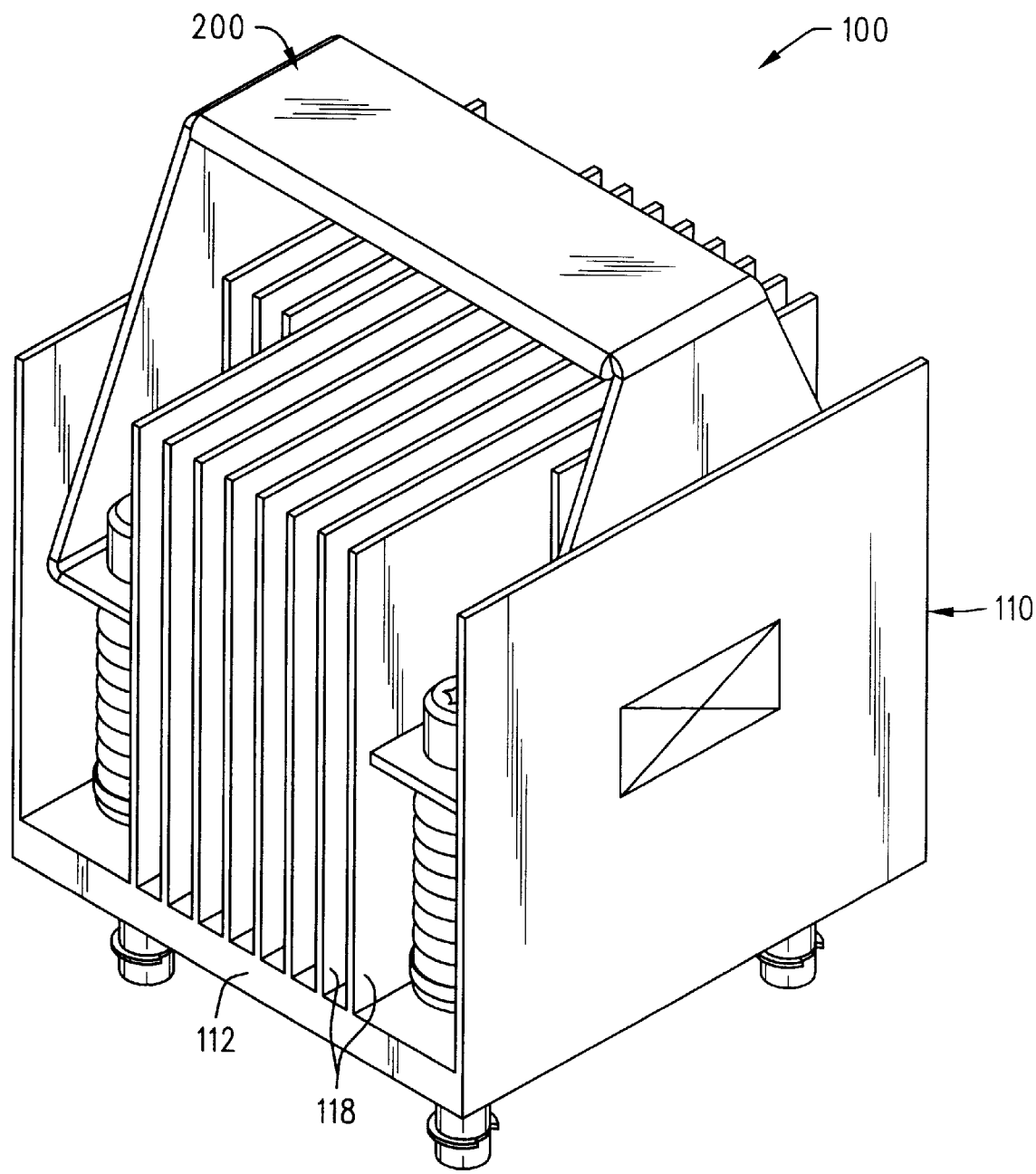
FIG. 1 is a top perspective view of a cooling device including a heat sink with a handle attached thereto.

FIGS. 1 through 6, in general, illustrate a cooling device 100 comprising: a heat sink 110, the heat sink 110 comprising: a base portion 112; and at least one cooling fin 118 thermally associated with the base portion 112. A handle 200 may be movably attached to the heat sink 110. The handle 200 may have a first operative position and a second operative position, the handle first operative position being located closer to the heat sink 110 than the handle second operative position.

FIGS. 1 through 6 also, in general, illustrate a method for mounting a heat sink 110 to a heat source 340. The method may comprise attaching the heat sink 110 to the heat source 340 using at least one fastening device 278. The method may further comprise urging the heat sink 110 into contact with the heat source 340 with a bias force from at least one spring 308 associated with the at least one fastening device 278 and captured between a handle member 200 and the heat sink 110.

Having generally described the cooling device 100, it will now be described in greater detail.

An embodiment of the cooling device 100 is illustrated in FIG. 1. The cooling device 100 may have a handle 200 movably attached to a heat sink 110. As will be described in greater detail below, the handle 200 may serve to facilitate mounting the heat sink 110 adjacent a heat-generating device (not shown in FIG. 1).

Figure 2:
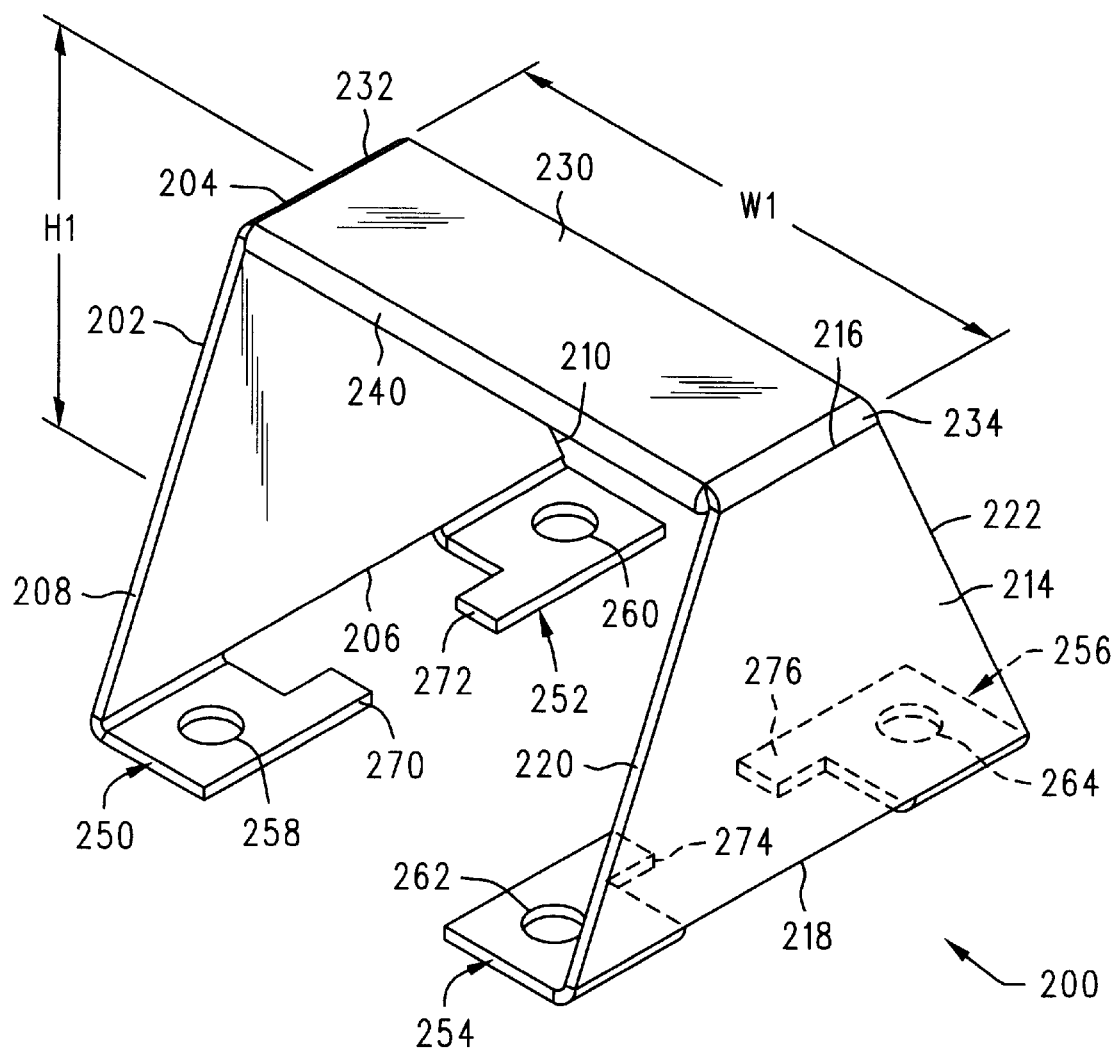
FIG. 2 is a top perspective view of the handle of FIG. 1.

The handle 200 is illustrated in FIG. 2 separate from the heat sink 110 of FIG. 1. The handle 200 may be fabricated from a single sheet of material, e.g., sheet metal. The handle 200 may have a left side 202 and a right side 214. The left side 202 may have an upper portion 204, a lower portion 206, a front portion 208, and a rear portion 210. A height Hi is measured between the top of the upper portion 204 and the bottom of the lower portion 206. Like the left side 202, the right side 214 may have an upper portion 216, a lower portion 218, a front portion 220, and a rear portion 222. The left side 202 and the right side 214 may have similar shapes and sizes. The handle 200 has a width W1 measured between the left side 202 and the right side 214.

The handle 200 may have a top side 230 that extends between the left side 202 and the right side 214. The top side 230 may have a left end portion 232 that joins the upper portion 204 of the left side 202. Likewise, the top side 230 may have a right end portion 234 that joins the upper portion 216 of the right side 214. The top side 230 may have a lip 240 formed thereon. The lip 240 may, as an example, be a portion of the top side 230 that is folded over in a conventional manner. The lip 240 may serve to create a smooth surface that prevents a user from encountering a sharp edge when the user grasps top side 230 of the handle 200.

The handle 200 may have a plurality of tabs attached thereto. The handle 200 illustrated in FIG. 2 has four tabs attached thereto, a first tab 250, a second tab 252, a third tab 254, and a forth tab 256. The first tab 250 may be joined to the left side 202 in the vicinity of the lower portion 206 and the front portion 208 and may have a first hole 258 formed therein. The second tab 252 may be joined to the left side 202 in the vicinity of the lower portion 206 and the rear portion 210 and may have a second hole 260 formed therein. The third tab 254 may be joined to the right side 214 in the vicinity of the lower portion 218 and the front portion 220 and may have a third hole 262 formed therein. The forth tab 256 may be joined to the right side 214 in the vicinity of the lower portion 218 and the rear portion 222 and may have a forth hole 264 formed therein.

The first tab 250 may have a first guide portion 270 formed thereon. The second tab 252 may have a second guide portion 272 formed thereon. The third tab 254 may have a third guide portion 274 formed thereon. The forth tab 256 may have a forth guide portion 276 formed thereon. The first guide portion 270 may face the second guide portion 272 and the third guide portion 274 may face the forth guide portion 276. As will be described below, the guide portions may serve to align the handle 200 relative to the heat sink 110.

Figure 3:
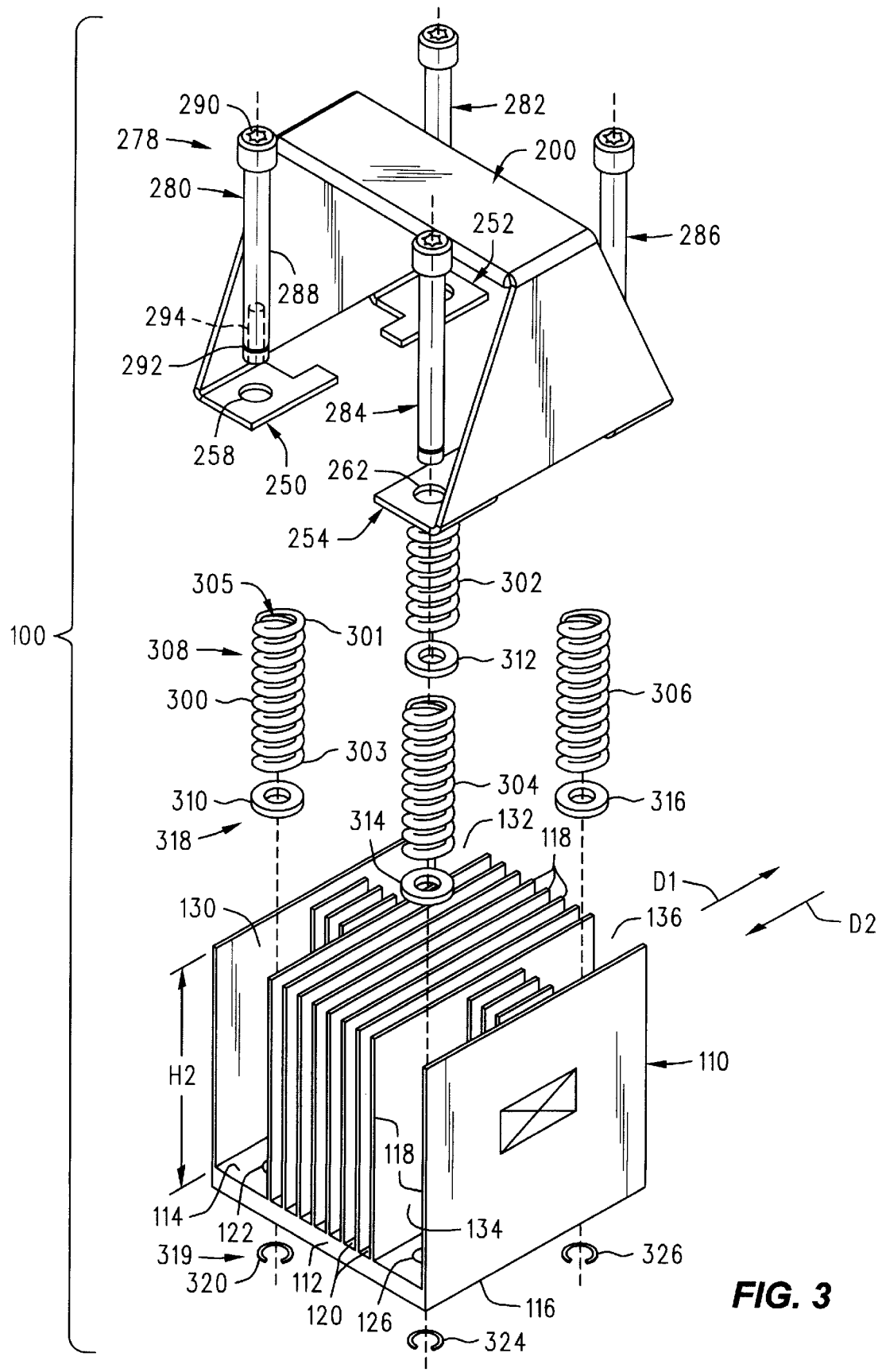
FIG. 3 is an exploded view of the cooling device of FIG. 1.

FIG. 3 illustrates an exploded view of the cooling device 100 and provides a detailed view of the heat sink 110. The heat sink 110 may have a base portion 112 that has a top surface 114 and a bottom surface 116. A plurality of cooling fins 118 may be attached to and extend from the top surface 114 of the base portion 112. The attachment of the cooling fins 118 to the base portion 112 provides for high thermal conductivity between the base portion 112 and the cooling fins 118. The cooling fins 118 may be arranged to form a plurality of air channels 120 extending therebetween. For example, the cooling fins 118 may be substantially planar elements and may be positioned substantially parallel to each other. The heat sink 110 may have spaces that allow the tabs attached to the handle 200 to be located adjacent the top surface 114 of the base portion 112, as is described below. The spaces are identified as a first space 130, a second space 132, a third space 134, and a fourth space 136.

The base portion 112 may have four holes extending therethrough. The holes may be located in the above-described spaces. Only a first hole 122 located in the first space 130 and a third hole 126 located in the third space 134 are illustrated in FIG. 3. As will be described below, the holes may serve to mount the handle 200 to the heat sink 110 and to mount the heat sink 110 adjacent a heat-generating device, not shown in FIG. 3. The locations of the holes in the base portion 112 may correspond to the locations of the holes 258, 260, 262, 264 in the handle 200.

The bottom surface 116 of the base portion 112 may be adapted to contact or be placed adjacent a heat-generating device that is to be cooled by the cooling device 100. For illustration purposes, the cooling device 100 illustrated herein is adapted to cool a device having a substantially planar heat-generating surface, such as an integrated circuit. Accordingly, the bottom surface 116 of the base portion 112 is illustrated herein as being substantially planar. It is to be understood, however, that the base portion 112 may have other shapes depending on the heat-generating device that is to be cooled.

Figure 4:
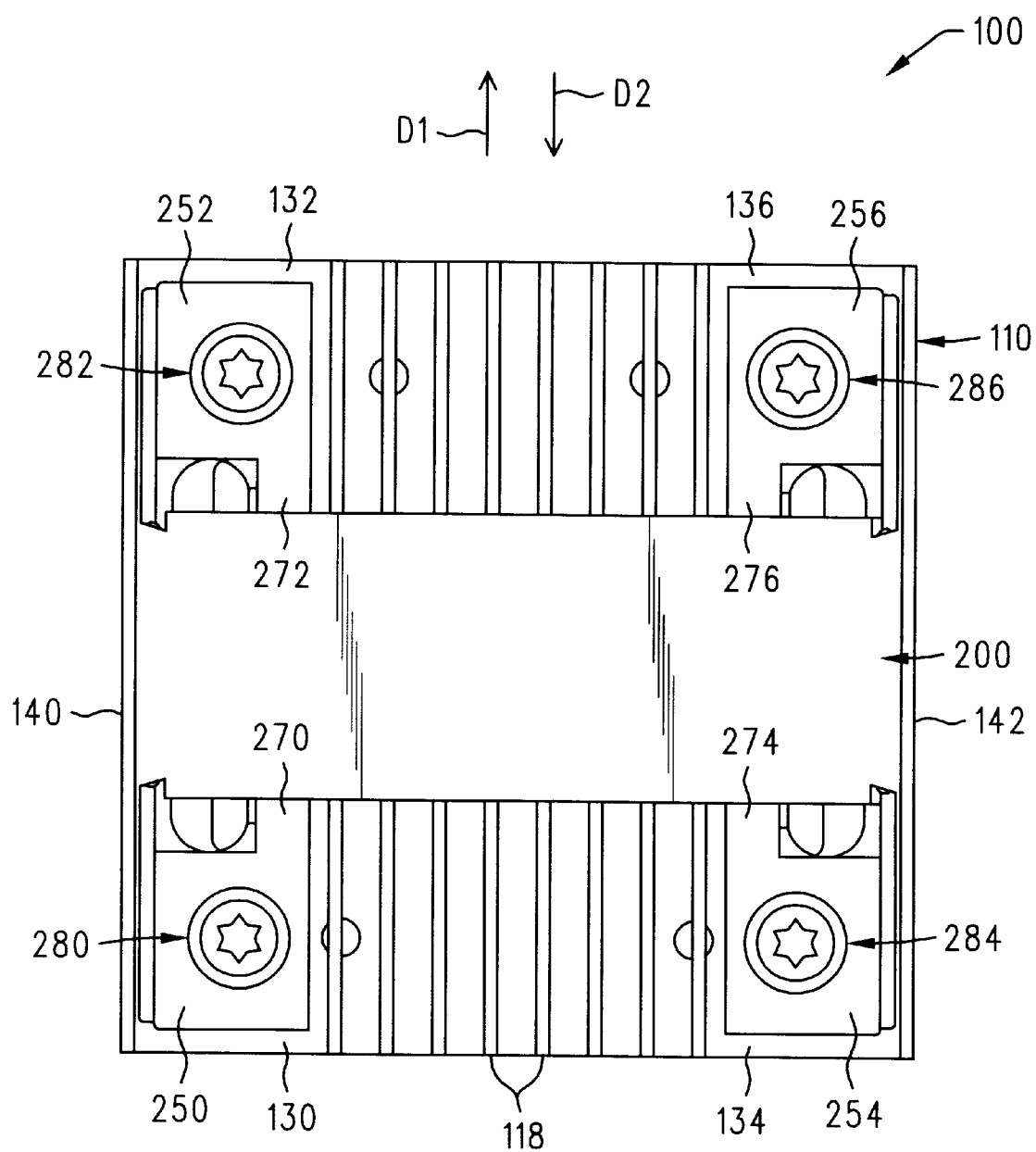
FIG. 4 is a top view of the cooling device of FIG. 1.

As described above, the plurality of cooling fins 118 may be substantially planar members arranged to be parallel to each other. This arrangement of the cooling fins 118 creates a plurality of unobstructed air channels 120 passing between the cooling fins 118. In use, air may be forced in either a first direction D1 or a second direction D2 through the air channels 120. Referring to FIG. 4, which is a top view of the heat sink 100, the cooling fins 118 may have a left cooling fin 140 and a right cooling fin 142. FIG. 4 also shows the arrangement of cooling fins 118 with the above-described spaces 130, 132, 134, 136 shown in greater detail. The left cooling fin 140 may be appropriately positioned with respect to the remaining cooling fins 118 so as to form the first space 130 and the second space 132. Likewise, the right cooling fin 142 may be appropriately positioned with respect to the remaining cooling fins 118 so as to form the third space 134 and the fourth space 136. As shown in FIG. 4, the first space 130 may be formed to accommodate the first tab 250 and the first guide portion 270 of the handle 200. The second space 132 may be formed to accommodate the second tab 252 and the second guide portion 272. The third space 134 may be formed to accommodate the third tab 254 and the third guide portion 274. The fourth space 136 may be formed to accommodate the forth tab 256 and the forth guide portion 276.

Referring again to FIG. 3, the heat sink 110 may be fabricated from a material having a high thermal conductivity. This high thermal conductivity provides for a large amount of heat to be transferred from a heat-generating device, not shown in FIG. 3, into the base portion 112 of the heat sink 110. Likewise, the heat transferred into the base portion 112 rapidly transfers to the cooling fins 118 where it is rapidly convected into the surrounding atmosphere. The rapid heat transfer causes the heat-generating device to be cooled efficiently.

As illustrated in FIG. 3, a plurality of screws 278, springs 308, and washers 318 may be used to attach the handle 200 to the heat sink 110. The cooling device 100 illustrated in FIG. 3 has four screw 278 attaching the handle 200 to the heat sink 110. The screws 278 are referred to individually as the first screw 280, the second screw 282, the third screw 284, and the fourth screw 286. Referring to the first screw 280, which is used to illustrate all the screws 278, the first screw may have a shaft 288, a head 290, a recess 292, and an internal thread 294. The shaft 288 may have a diameter that is slightly smaller than the diameter of the hole 258 in the first tab 250 and the diameter of the first hole 122 in the base portion 112. Accordingly, the shaft 288 may pass in close fitting relationship through the hole 258 and the first hole 122. The head 290 has a diameter that is larger than the diameter of the hole 258. Accordingly, the head 290 is not able to pass through the hole 258. Likewise the head 290 is not able to pass through the first hole 122. It should be noted that the screws 278 are described herein as being captive screws. The may, alternatively, be referred to as captive nuts.

The springs 308 are referred to individually as the first spring 300, the second spring 302, the third spring 304, and the fourth spring 306. Referring to the first spring 300 as an example, the springs 308 may be conventional coil springs having first portions 301 and second portions 303. The first portions 301 may be adapted to contact the tabs on the handle 200 and the second portions 303 may be adapted to contact the washers 318. Alternatively, the second portions 303 may be adapted to contact the top surface 114 of the base portion 112. Holes 305 extend through the springs 308 between the first portions 301 and the second portions 303. The holes 305 may have diameters that are slightly larger than the diameters of the shafts 288 of the screws 278.

The washers 318 are located between the springs and the top surface 114 of the base portion 112 of the heat sink 110. The washers are referred to individually as the first through the fourth washers and referenced numerically as 310, 312, 314, and 316 respectively. The washers 318 may be appropriately sized to allow the screws 278 to pass therethrough. Four clips 319 may be located adjacent the bottom surface 116 of the base portion 112. For illustration purposes, only three clips are shown in FIG. 3. The clips 319 are referred to as the first clip 320, the third clip 324, and the fourth clip 326. The clips 319 have internal diameters that are slightly smaller than the diameters of the screws 278 and external diameters that are slightly larger than the diameters of the screws 278. The clips 319 are appropriately sized to elastically fit into and be retained in the recesses 292 of the shafts 294 of the screws 278 in a conventional manner.

When the cooling device 100 is assembled, the screws 278 pass through the holes in the tabs of the handle 200, through the springs 308, and through the holes in the base portion 112. The clips 319 are placed over the shafts 288 so as to fit into the recesses 292. Accordingly, the clips 319 serve to limit the movement of the screws 278 through the base portion 112, which makes the screws 278 captive.

Figure 5:
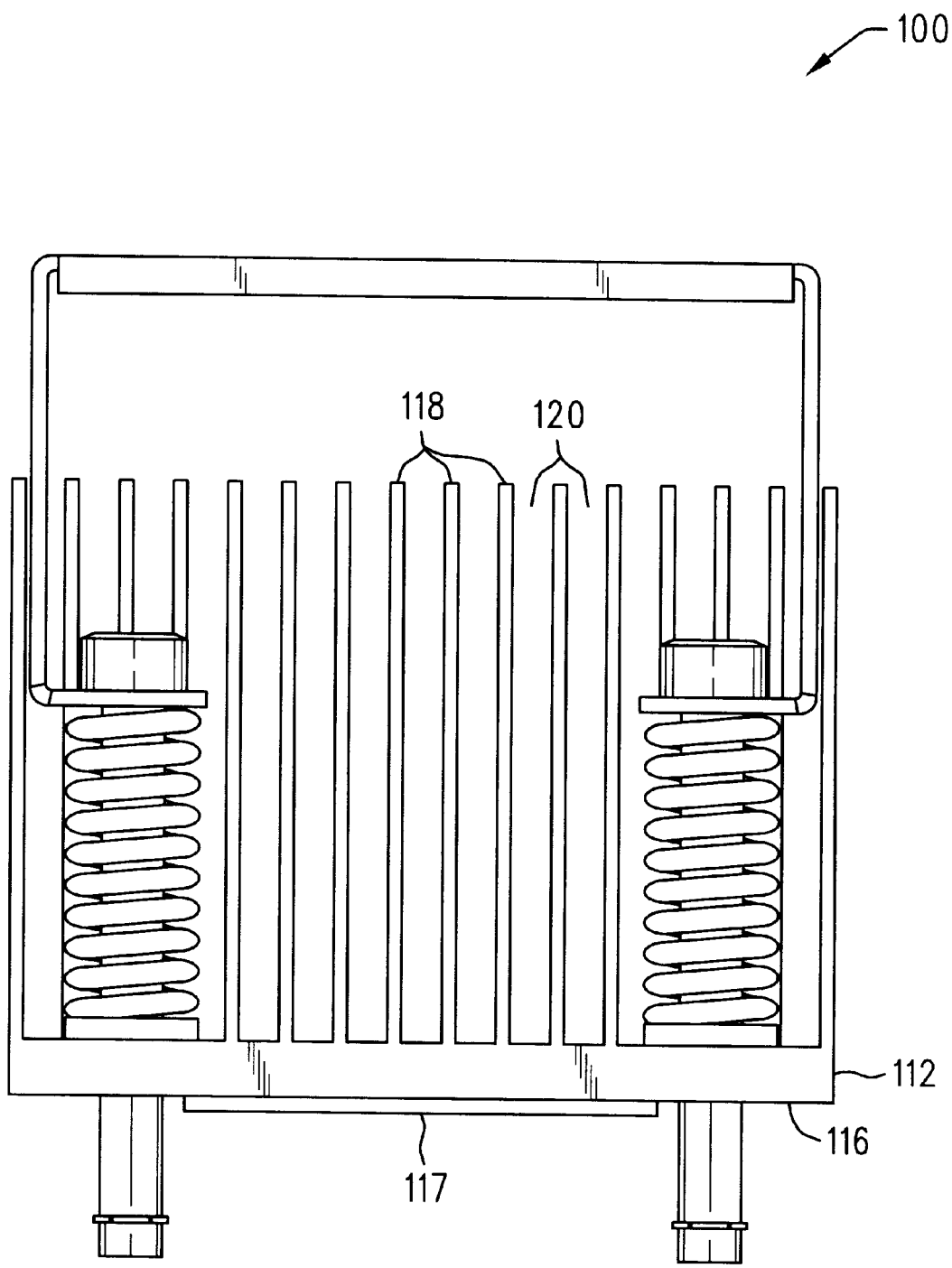
FIG. 5 is a side view of the cooling device of FIG. 1.

Referring to FIG. 5, which is a side view of the cooling device 100, a plate 117 may be affixed to the bottom surface 116 of the base portion 112. The plate 117 may serve to contact a heat-generating device in order to enhance the heat transfer from the heat generating device into the base portion 112.

Having described the cooling device 100, it will now be described being used to cool a heat generating device 340, FIG. 6.

Figure 6:
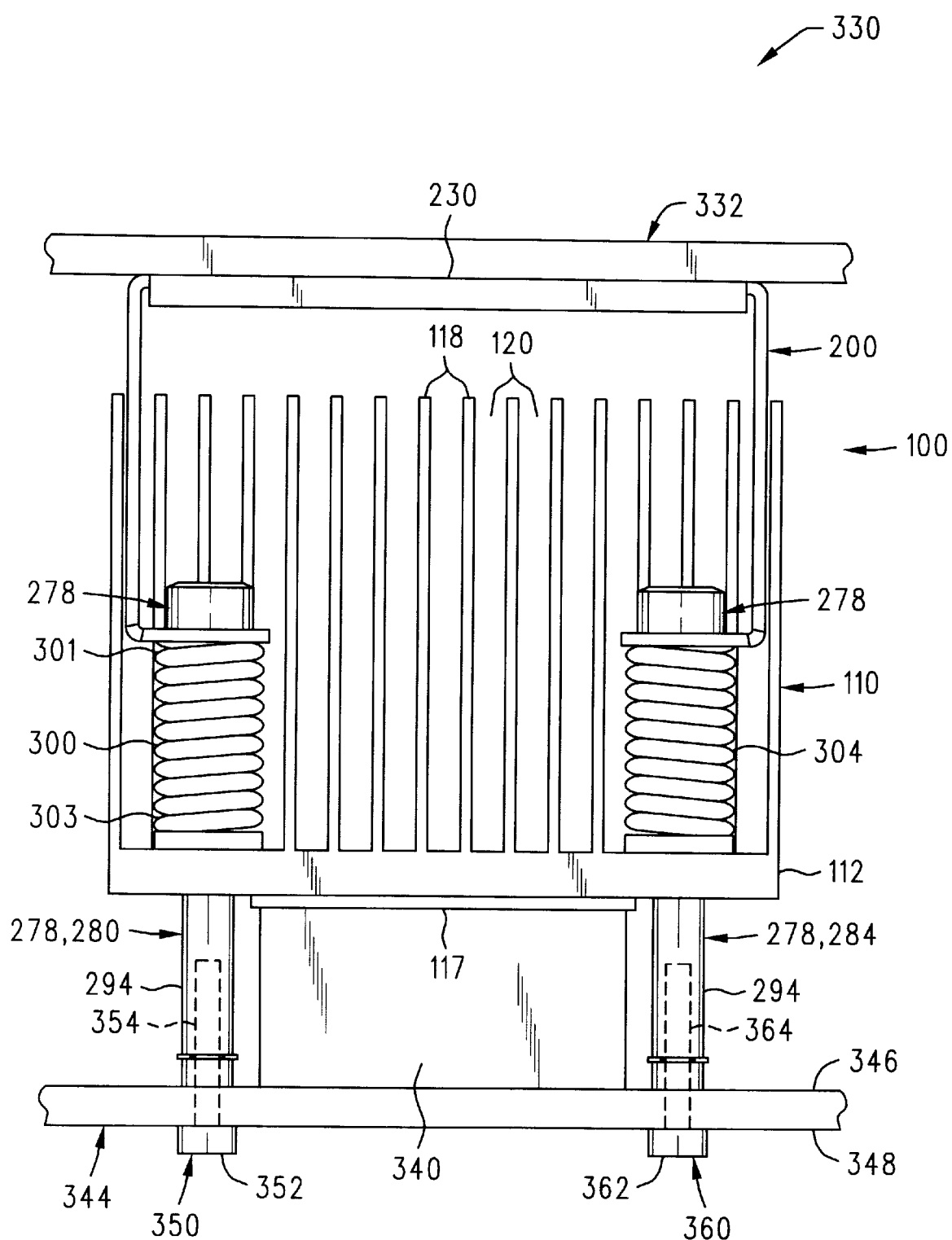
FIG. 6 is a side view of the cooling device of FIG. 1 located within an electronic module and secured to a heat-generating device.

FIG. 6 illustrates the cooling device 100 located within a module 330. The module 330 may be a conventional electronic device or chassis that contains electronic components, including a heat generating device 340. The module 330 may be a conventional electronic module. The module 330 may have a cover 332, a substrate 344, and other structural components that are not illustrated in FIG. 6.

The substrate 344 may, as an example, be a conventional printed circuit board. For illustration purposes, structural components that fasten the substrate 344 to the module 330 are not illustrated in FIG. 6. The substrate 344 may have a top surface 346 and a bottom surface 348. The substrate 344 may have a plurality of screws passing therethrough, which align with the screws 278 associated with the cooling device 100. For illustration purposes, only two screws are shown in FIG. 6 passing through the substrate 344. The two screws are referred to as the first screw 350 and the third screw 360. The first screw 350 may have a head 352 that abuts the bottom surface 348 of the substrate 344 and a threaded portion 354 that passes through the substrate 344. Likewise, the third screw 360 may have a head 362 that abuts the bottom surface 348 of the substrate 344 and a threaded portion 364 that passes through the substrate 344. Alternatively, the screws 350 and third screw 360 may be studs that are permanently affixed to the substrate 344.

The cover 332 may be movable relative to the heat generating device 340. The cover 332 may allow a user to have access to the substrate 344. Thus, access to the cooling device 100 may be gained by removing the cover 332 from the module 330 in a conventional manner.

The cooling device 100 is illustrated as being located adjacent or abutting the heat generating device 340. The heat generating device 340 may, as an example, be an electronic device or component that generates heat when in use. The heat generating device 340 may be fastened to the substrate 344 in a conventional manner, i.e., the heat generating device 340 may be soldered to the substrate 344.

Prior to installing the cooling device 100 within the module 330, the cover 332 may be removed from the module 330. A conventional thermally conductive compound may be located on the heat generating device 340 and/or the plate 117 of the base 112. The thermally conductive compound serves to facilitate the transfer of heat from the heat generating device 340 to the cooling device 100.

A user may grasp the handle 200 and maneuver the cooling device 100 into the module 330 so that the plate 117 abuts or is adjacent the heat generating device 340. Securing the cooling device 100 to the substrate 344 involves fastening the screws 278 of the cooling device 100 to the screws 350 and 360 that pass through the substrate 344. The internal thread 294 of the first screw 280 of the cooling device 100 is threaded over the first screw 350 of the substrate 344. Likewise, the internal thread 294 of the third screw 284 of the cooling device 100 is threaded over the third screw 360.

As the screws 278 of the cooling device 100 are threaded over the screws 350 and 360 the springs 300 and 304 compress and the handle 200 is drawn toward the base portion 112. The compression of the springs 300, 304 causes a spring force to be applied between the cooling device 100 and the substrate 344. The spring force maintains the cooling device 100 in a position wherein it remains abutted against the heat generating device 340. As the cooling device 100, the heat generating device 340, and the substrate 344 experience thermal expansion and contraction and other stresses and forces, the cooling device 100 will remain abutted against the heat generating device 340. Accordingly, the cooling device 100 will continue transferring heat from the heat generating device 340.

As shown in FIG. 6, as the first screw 280 and the third screw 284 are threaded toward the substrate 344, the handle 200 moves toward the substrate 344. Eventually, the top side 230 of the handle 200 is located in close proximity to the cooling fins 118, which reduces the volume occupied by the cooling device 100. Accordingly, the cover 332 may be placed back onto the module 330 and may be located in close proximity to the cooling fins 118 because the handle 200 is in close proximity to the heat sink 110 and does not occupy excessive space.

When the handle 200 is located in the proximity of the heat sink 110, it is sometimes referred to as being in a first position. When the handle 200 is located away from the heat sink 110, as illustrated in FIG. 3, the handle 200 is sometimes referred to as being in a second position.

The cooling device 100 has been illustrated in FIG. 6 as being secured to the substrate 344 by use of the first screw 280 and the third screw 284. Referring to FIG. 3, it should be noted that the cooling device 100 may also be secured to the substrate 344, FIG. 6, by use of the second screw 282 and the forth screw 286. The second screw 282 and the forth screw 286 may be fastened to screws, not shown in FIG. 6, that pass through the substrate 344 and align with the second screw 282 and the forth screw 286.

Referring again to FIG. 6, air may be forced through the air channels 120 to increase convection. This increased convection causes more heat to be drawn into the heat sink 110 from the heat generating device 340. Accordingly, the heat generating device 340 is cooled more efficiently.

The movable handle 200 serves to facilitate the installation and removal of the cooling device 100 into and out of the module 330. The handle 200 additional serves to provide a surface for a user to grasp in the event the heat sink 110 is too hot to grasp. Accordingly, the cooling device 100 may be removed from the heat generating device 340 when the heat sink 110 is hot. In another embodiment of the cooling device 100, the handle 200 may be fabricated from a material has a lower thermal conductivity than the heat sink 110. This keeps heat from being transferred into the handle 200 and assures that the handle 200 does not become too hot for a user to grasp.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling device comprising:
    a heat sink, said heat sink comprising:
        a base portion; and
        at least one cooling fin attached to said base portion;
    a handle movably attached to said heat sink;
        said handle having a first operative position and a second operative position, said handle being in said first operative position when said handle is located in the proximity of said heat sink and said handle being in said second operative position when said handle is not located in the proximity of said heat sink.

2. The cooling device of claim 1 wherein said handle is movably attached to said heat sink base portion.

3. The cooling device of claim 1 and further comprising at least one detent mechanism located between said heat sink and said handle.

4. The cooling device of claim 3 wherein said at least one detent mechanism has a first portion and a second portion, wherein said first portion is adapted to contact said heat sink and wherein said second portion is adapted to contact said handle.

5. The cooling device of claim 3 wherein said at least one detent mechanism first portion is adapted to contact said heat sink base portion.

6. The cooling device of claim 3 wherein said at least one detent mechanism is a spring.

7. The cooling device of claim 3 and further comprising at least one fastening device, wherein said at least one detent mechanism is a coil spring, and wherein said at least one fastening device passes through said handle, through said coil spring, and through said base portion.

8. The cooling device of claim 7 wherein said at least one fastening device is captively attached to said cooling device.

9. The cooling device of claim 7 wherein said at least one fastening device is a captive screw.

10. The cooling device of claim 7 wherein said at least one fastening device comprises a shaft having a first end and a second end, said first end having a head mounted thereto and being located proximate said handle, said second end having a threaded hole formed therein.

11. The cooling device of claim 1 wherein said heat sink has a first thermal conductivity associated therewith, wherein said handle has a second thermal conductivity associated therewith, and wherein said first thermal conductivity is greater than said second thermal conductivity.

12. The cooling device of claim 1 wherein said at least one cooling fin comprises at least two cooling fins having a channel located therebetween, wherein said handle has a guide portion associated therewith, and wherein said guide portion is located in said channel.

13. A cooling device comprising:
    a heat sink, said heat sink comprising:
        a base portion; and
        at least one cooling fin attached to said base portion;
    a handle movably attached to said heat sink base portion; and
    a detent mechanism, said detent mechanism having a first portion and a second portion, said first portion being adjacent said heat sink base portion, and said second portion being adjacent said handle;
    said handle having a first operative position and a second operative position, said handle being in said first operative position when said handle is located in the proximity of said heat sink and said handle being in said second operative position when said handle is not located in the proximity of said heat sink.

14. The cooling device of claim 13 wherein said detent mechanism is a coil spring.

15. The cooling device of claim 13 wherein said detent mechanism is a coil spring and further comprising a fastener, said fastener passing through said handle, said coil spring, and said heat sink base portion.

16. The cooling device of claim 15 wherein said fastener is captively affixed to said cooling device.

17. The cooling device of claim 13 wherein said at least one cooling fin comprises at least two cooling fins having a channel located therebetween and wherein at least a portion of said handle is located in said channel.

18. A cooling device comprising:

a heat sink for removing heat from a heat source;

a fastening means for fastening said heat sink to said heat source; and a biasing means for urging said heat sink into contact with said heat source, said biasing means captured between a handle member and said heat sink;

said handle member being movably attached to said heat sink and having a first operative position and a second operative position, said handle member being in said first operative position when said handle member is located in the proximity of said heat sink and said handle member being in said second operative position when said handle member is not located in the proximity of said heat sink.

* * * * *

UNITED STATES PATENT AND TRADEMARK OFFICE
CERTIFICATE OF CORRECTION

PATENT NO. : 6,374,906 B1  Page 1 of 1
DATED : April 23, 2002
INVENTOR(S) : Eric C. Peterson et al.

It is certified that error appears in the above-identified patent and that said Letters Patent is hereby corrected as shown below:

Column 3,
Line 30, delete "Hi" and insert therefor -- H1 --

Column 5,
Line 61, delete "319are" and insert therefor -- 319 are --

Column 7,
Lines 45-46, delete "installation and removal" and insert therefor -- manipulation (installation and removal) --

Column 8,
Line 1, after "heat sink;" insert -- whereby the handle serves to provide a surface for a user to manipulate the cooling device --
Line 54, after "base portion;" insert -- whereby the handle serves to provide a surface for a user to manipulate the cooling device --

Column 10,
Line 3, after "heat sink;" insert -- whereby the handle serves to provide a surface for a user to manipulate the cooling device --

Signed and Sealed this

Twenty-seventh Day of July, 2004

JON W. DUDAS
*Acting Director of the United States Patent and Trademark Office*